(12) United States Patent  
Ikeda et al.

(10) Patent No.: US 8,966,750 B2  
(45) Date of Patent: Mar. 3, 2015

(54) METHOD OF MANUFACTURING A MULTILAYERED PRINTED WIRING BOARD

(75) Inventors: Tomoyuki Ikeda, Ibi-gun (JP); Naoaki Fujii, Ibi-gun (JP); Seiji Izawa, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 614 days.

(21) Appl. No.: 13/167,305

(22) Filed: Jun. 23, 2011

(65) Prior Publication Data

US 2011/0247208 A1 Oct. 13, 2011

Related U.S. Application Data

(62) Division of application No. 11/935,207, filed on Nov. 5, 2007, now Pat. No. 8,242,379.

(60) Provisional application No. 60/864,282, filed on Nov. 3, 2006.

(51) Int. Cl.
*H01K 3/10* (2006.01)
*H01L 21/48* (2006.01)
(Continued)

(52) U.S. Cl.
CPC .......... *H01L 21/4857* (2013.01); *H01L 21/486* (2013.01); *H01L 23/49822* (2013.01); *H01L 23/49827* (2013.01); *H05K 3/4602* (2013.01); *H01L 2224/16* (2013.01); *H01L 2924/01004* (2013.01); *H01L 2924/01046* (2013.01); *H01L 2924/01078* (2013.01); *H01L 2924/01079* (2013.01); *H01L 2924/15174* (2013.01);

(Continued)

(58) Field of Classification Search
CPC .................. H05K 2201/09563; H05K 3/429; H05K 3/4655; H05K 3/465; H05K 1/0298; B32B 2457/08
USPC ............ 29/852, 825, 829, 830, 846; 174/255, 174/256, 261, 262, 263, 264
See application file for complete search history.

(56) References Cited

U.S. PATENT DOCUMENTS 3,471,631 A 10/1969 Quintana
6,376,052 B1 4/2002 Asai et al.
(Continued)

FOREIGN PATENT DOCUMENTS

JP 05029760 2/1993
JP 07-033991 2/1995
JP 2004-200501 7/2004

*Primary Examiner* — Thiem Phan
(74) *Attorney, Agent, or Firm* — Oblon, McClelland, Maier & Neustadt, L.L.P.

(57) ABSTRACT

A method of manufacturing a multilayered printed wiring board including forming a multilayered core substrate including insulation layers and one or more stacked via structures formed through the insulation layers, the stacked via structure including vias formed in the insulation layers, respectively, the insulation layers in the multilayered core substrate including at least three insulation layers and each of the insulation layers in the multilayered core substrate including a core material impregnated with a resin, and forming a build-up structure over the multilayered core substrate and including interlaminar insulation layers and conductor circuits, each of the interlaminar insulation layers including a resin material without a core material.

17 Claims, 14 Drawing Sheets

(51) Int. Cl.
*H01L 23/498* (2006.01)
*H05K 3/46* (2006.01)
*H05K 1/11* (2006.01)

(52) U.S. Cl.
CPC ............ *H01L 2924/15311* (2013.01); *H01L 2924/15312* (2013.01); *H01L 2924/3011* (2013.01); *H05K 1/112* (2013.01); *H05K 1/115* (2013.01); *H05K3/4652* (2013.01); *H05K 2201/0394* (2013.01); *H05K 2201/096* (2013.01); *H05K 2201/09781* (2013.01); *H05K 2201/10674* (2013.01); *H05K 2203/0733* (2013.01); *H01L 2924/01019* (2013.01); *H01L 2224/16225* (2013.01)
USPC .............. 29/852; 29/825; 29/829; 29/830; 29/846

(56) References Cited

U.S. PATENT DOCUMENTS

| | | |
|---|---|---|
| 6,490,170 B2 | 12/2002 | Asai et al. |
| 6,534,723 B1 | 3/2003 | Asai et al. |
| 6,548,767 B1 | 4/2003 | Lee et al. |
| 6,828,510 B1 * | 12/2004 | Asai et al. ............... 174/255 |
| 6,900,395 B2 | 5/2005 | Jozwiak et al. |
| 7,071,424 B1 * | 7/2006 | Shirai et al. ............. 174/263 |
| 7,498,522 B2 | 3/2009 | Itoh |
| 7,626,829 B2 | 12/2009 | Watanabe et al. |
| RE41,242 E | 4/2010 | Asai et al. |
| 7,834,273 B2 | 11/2010 | Takahashi et al. |
| 7,905,014 B2 | 3/2011 | Ikeda |
| 7,973,249 B2 | 7/2011 | Takahashi et al. |
| 2005/0039948 A1 | 2/2005 | Asai et al. |

\* cited by examiner (A)

(B)

(A)

(B)

(A)

Top view of a multilayered core substrate (B)

Top view of a PWB (C)

Top view of a PWB

METHOD OF MANUFACTURING A MULTILAYERED PRINTED WIRING BOARD

CROSS-REFERENCE TO RELATED APPLICATIONS

This application is a divisional of and claims the benefit of priority under 35 U.S.C. §120 from U.S. Ser. No. 11/935,207, filed Nov. 5, 2007, which claims the benefit of priority to a U.S. application, 60/864,282, filed Nov. 3, 2006. The contents of those applications are incorporated herein by reference in its entirety.

BACKGROUND OF INVENTION

1. Field of the Invention

The present invention is related to a multilayered printed wiring board (hereinafter referred to as a multilayered PWB), which can be used for IC packaging with mounted electronic components such as IC chips.

2. Discussion of the Background

A built-up multilayered PWB is used as a substrate for, for example, IC packaging mounted with a semiconductor element for an MPU or the like. Those multilayered PWBs are formed as follows: On a core substrate made with a resin material with core material (such as a glass epoxy resin), a interlaminar insulation material without core material (such as a resin made mainly with epoxy resin) is laminated, and non-through-hole via holes are formed by a laser or the like; inside the via holes, conductor layers are deposited by performing plating or the like to electrically connect the core substrate and the conductor layers on the interlaminar insulation layers; and on the surfaces, solder bumps and solder layers are formed to mount an IC chip, electronic components or the like. Full-additive methods and semi-additive methods are used for the above.

Also, multilayered PWBs are formed as follows: Copper-laminated insulation layers as an insulation material are laminated and non-through-hole via holes are formed by a laser or the like; inside the via holes, conductor layers are formed by plating or with paste for electrical connections; and on the surfaces, solder bumps and solder layers are formed to mount IC chips, electronic components or the like. For example, Japanese Patent Laid-Open Publication Hei 5-029760 is directed to a process to build up insulation layers on a core substrate, and Japanese Patent Laid-Open Publication Hei 7-33991 is directed to resin compound for interlaminar insulation layers. The contents of the above mentioned publications are incorporated herein by reference in their entirety.

SUMMARY OF THE INVENTION

According to one aspect of the present invention, a multi-layered printed wiring board includes a multilayered core substrate including multiple insulation layers and one or more stacked via structure formed through the multiple insulation layers, the stacked via structure including multiple vias formed in the multiple insulation layers, respectively, and a build-up structure formed over the multilayered core substrate and including multiple interlaminar insulation layers and multiple conductor circuits, each of the interlaminar insulation layers including a resin material without a core material. The multiple insulation layers in the multilayered core substrate have three or more insulation layers and each of the insulation layers in the multilayered core substrate includes a core material impregnated with a resin.

According to another aspect of the present invention, a method of manufacturing a multilayered printed wiring board includes forming a multilayered core substrate including multiple insulation layers and one or more stacked via structure formed through the multiple insulation layers, the stacked via structure including multiple vias formed in the multiple insulation layers, respectively, the multiple insulation layers in the multilayered core substrate having three or more insulation layers and each of the insulation layers in the multilayered core substrate including a core material impregnated with a resin, and forming a build-up structure over the multilayered core substrate and including multiple interlaminar insulation layers and multiple conductor circuits, each of the interlaminar insulation layers including a resin material without a core material.

BRIEF DESCRIPTION OF THE DRAWINGS

A more complete appreciation of the invention and many of the attendant advantage thereof will be readily obtained as the same becomes better understood by reference to the following detailed description when considered in connection with the accompanying drawings, wherein.

DESCRIPTION OF THE EMBODIMENTS

Figure 1:
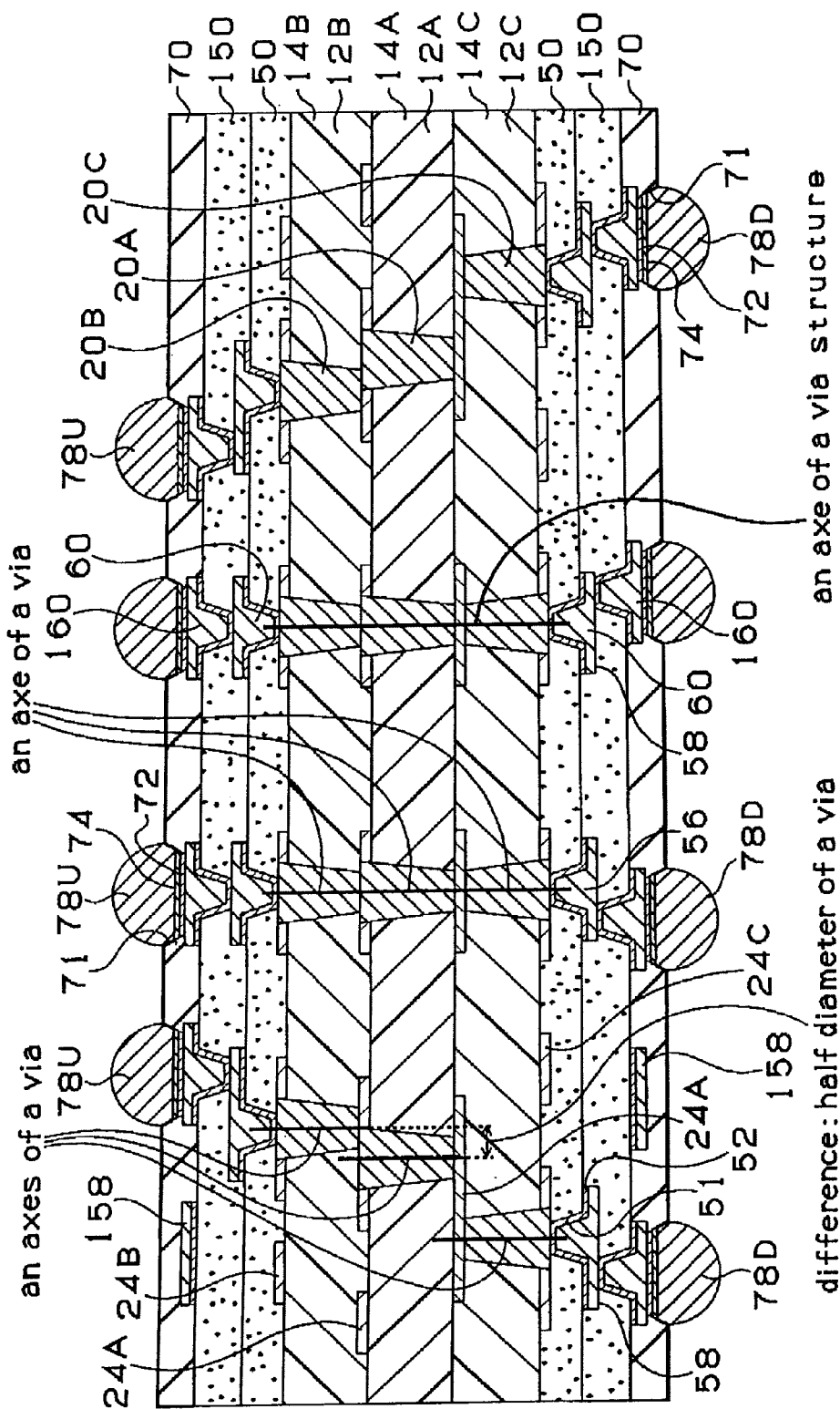
FIG. 1 is a cross-sectional view illustrating a multilayered PWB according to an embodiment of the present invention.

The embodiments will now be described with reference to the accompanying drawings, wherein like reference numerals designate corresponding or identical elements throughout the various drawings.

A method for manufacturing a multilayered PWB according to an embodiment of the present invention is described below.

(1) For a circuit substrate as a basic unit, a single-sided or double-sided copper-laminated insulation base material may be used as a starting material. For the above insulation base material, insulation material may be selected from, for example, glass cloth-epoxy resin base material, glass cloth-bismaleimide triazine resin base material, glass cloth-polyphenylene ether resin base material, alamide non-woven fabric-epoxy resin base material, or alamide non-woven fabric-polyimide resin base material. Especially, glass cloth-epoxy resin base material is preferred. The thickness of the above insulation base material is preferably about 250 μm or less.

To form via-hole openings using a laser on the above circuit substrate, a direct laser method in which the copper foil and the insulation base material are irradiated by a laser to make an opening simultaneously or a conformal method in which, after etching off the copper foil in the areas corresponding to via holes in the copper foil, the insulation base material is irradiated by a laser to make an opening may be used. The thickness of copper foil laminated on the above insulation base material is preferably in an approximate range of 5-20 μm.

When forming via-hole openings in an insulation base material by using laser processing, copper-foil portions corresponding to via-hole positions may be deformed, but within the above range, it is easier to form a predetermined wiring circuit and to etch a conductive circuit pattern having a microscopic line width.

The thickness of the copper foil may be adjusted by half-etching. In this case, a thicker copper foil than the above range is used and the thickness after the etching process is adjusted to be in the above range.

When using a double-sided copper-laminated substrate as a circuit substrate, the copper foils are in the above range but may have a different thickness on either surface. This does not impede the following steps. For the above insulation base material and copper foil, it is preferred to use either a single-sided or double-sided copper-laminated layer, which is obtained by laminating and thermal-pressing a copper foil and a B-stage prepreg prepared by impregnating a glass cloth with epoxy resin. With such a copper-laminated layer, during the manufacturing process after the copper foil is etched, wiring patterns or via-hole positions are not displaced and a precise alignment can be achieved.

(2) Next, via-hole openings are formed on the insulation base material by using a laser. If a single-sided copper-laminated layer is used to form a circuit substrate, a surface of the insulation base material on the opposite side of the copper-laminated surface is irradiated by a $CO_2$ gas laser to form openings that pass through the insulation base material and reach the copper foil (or a conductor circuit pattern).

If a double-sided copper-laminated layer is used to form a circuit substrate, the surface of a copper foil-laminated insulation base material is irradiated by a $CO_2$ gas laser to form openings that pass through both the copper foil and the insulation base material and reach the other copper foil-laminated surface (or a conductor circuit pattern) of the insulation base material. Alternatively, holes which is slightly smaller than the via-hole diameter are formed by etching the surface of a copper foil laminated on one surface of the insulation base material, then using these holes as an irradiation target when irradiating a $CO_2$ laser, openings are formed which pass through the insulation base material and reach the copper foil laminated on the other surface (or a conductor circuit pattern) of the insulation base material.

The above laser irradiation process is conducted by using pulse-generating $CO_2$ laser processing equipment. The processing conditions are set up so that side walls of the via-hole openings are tapered with respect to the surface of the insulation base material at an angle of approximately 60-90 degrees.

For example, by setting the conditions for pulse energies in the approximate range of 0.5 to 100 mJ, pulse width in the approximate range of 1-100 μs, pulse intervals approximately 0.5 ms or longer, and number of shots in the range of 2-10, the tapering angles of the opening side walls can be adjusted.

The diameter of via-hole openings which can be formed under the above processing conditions is preferably in the approximate range of 50-250 μm. Within that range, the tapered shape can be reliably formed and the wiring density can be increased.

(3) A desmearing process may be conducted to remove the resin residue remaining on side walls and bottom surfaces of the openings formed in the above step (2). Such a desmearing process may be conducted using a wet process such as a chemical liquid process using acid or oxidizing agents (for example, chromic acid, potassium permanganate), and a dry process such as oxygen plasma discharging, corona discharging, ultraviolet laser, or excimer laser. A desmearing process may be selected from the above list depending on the type of insulation base material, its thickness, the via-hole opening diameter, laser beaming conditions and other factors to estimate the amount of residue.

(4) Next, on the copper-foiled surface of the substrate after the desmearing process, electrolytic copper plating using a copper foil as a plating lead is performed to form via holes (also referred as via hole structures, conductive vias or via holes, or vias) whose openings are completely filled with electrolytic copper plating (filled via). After the electrolytic copper plating is performed, a portion of the copper plating, if it bulges over the via-hole openings, may be removed and leveled by belt-sander polishing, buff polishing, or etching.

Also, electrolytic copper plating may be performed after electroless plating is performed. In this case, metals such as copper, nickel, and silver may be used for an electroless plating film.

(5) Then, on the electrolytic copper-plated layer formed on the substrate in the above step (4), an etching resist layer is formed. An etching resist layer may be prepared either by coating a resist liquid or by laminating a ready-made film. A mask having a printed circuit pattern is placed on the resist layer, which is then exposed to light and developed to form an etching resist layer. Then, portions of the metal layer where the etching resist is not formed are etched away to form a conductor circuit pattern including a conductor circuit and lands (also referred as land portions). For the above etching liquid, it is preferred to select at least one solution from the solutions of sulfuric acid-hydrogen peroxide, persulfate, copper (II) chloride, and iron (II) chloride.

As a preliminary preparation to form a conductor circuit by etching the above copper foil and electrolytic copper plating film, the thickness may be adjusted by etching the entire surface of the electrolytic copper plating film so that a fine pattern can be formed more easily. As part of the conductor circuit, a land preferably has an inner diameter almost the same size as the via-hole diameter or an outer diameter larger than the via-hole diameter. The land diameter is preferably in the range of 75-350 μm. By setting the land diameter in the above range, via holes function as multiple stacked via even if the via positions are shifted. A circuit substrate prepared according to the above steps (1)-(5) is used as a lamination core and an insulation resin layer and a copper foil are laminated on one surface or both surfaces of the circuit substrate. By such, the substrate becomes a multilayered substrate by the added one or two insulation resin layers.

By following the same procedure as above steps (2)-(5), via holes and conductor circuits are formed on the laminated insulation resin layers. Then, by further laminating insulation resin layers and copper foil and repeating the same procedure as above steps (2)-(5), a multilayered PWB having even more multiple layers can be obtained. In the above-described steps, an insulation resin layer is added layer by layer to form multiple insulation resin layers. Two or more insulation resin layers each of which is a unit of a circuit substrate may be laminated and then thermal-pressed all at once to form a multilayered core substrate.

In the multilayered core substrate formed according to the above steps, via holes formed in each laminated circuit substrate or insulation resin layer are tapered with an inner angle in the range of 60-90 degrees with respect to the surface of the circuit substrate or insulation resin layer where the via holes are formed. The via holes formed in at least one insulation resin layer including a circuit substrate as the lamination core make up the first via group and the via holes formed in at least one insulation resin layer facing the insulation resin layer where the first via group is formed make up the second via group. A multiple stacked-via structure is constructed with the first via group and second via group. Each via group preferably is tapered with an inner angle in the range of 60-90 degrees with respect to the surfaces of insulation resin layers where the via holes are formed.

A multilayered PWB is formed by building up interlaminar insulation layers and conductor circuits on the above multilayered core substrate. A solder resist layer is set on the topmost layer of the multilayered PWB, and solder bumps are formed on the pads formed in the openings in the solder resist layer.

A solder transfer method or a printing method may be used to supply the above solder bumps. A solder transfer method takes the following steps: laminate a solder foil on a prepreg, form a solder carrier film with a solder pattern by etching away the solder foil leaving only the areas corresponding to the openings, coat flux in the solder resist openings on the substrate, laminate the solder carrier film so that the solder pattern makes contact with the pads, and then heat the film to transfer the solder pattern.

On the other hand, a printing method takes the following steps: place on the substrate a printing mask (a metal mask) having openings in the area corresponding to the pads, print a solder paste and then process with heat. For solders to form such solder bumps, Sn/Ag solder, Sn/In solder, Sn/Zn solder and Sn/Bi solder or the like may be used.

Figure 13:
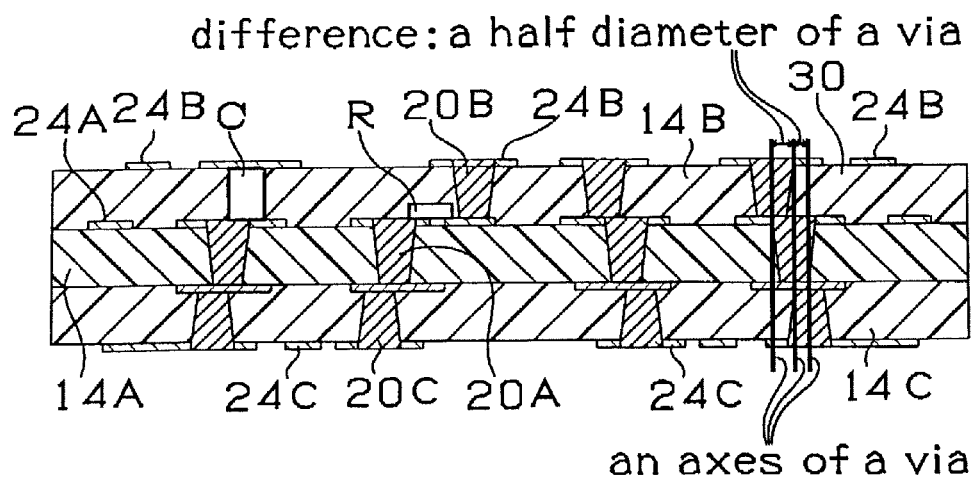
FIGS. 13(A) and 13(B) are cross-sectional views illustrating multilayered core substrates of multilayered PWBs according to still other embodiments of the present invention.
Figure 13:
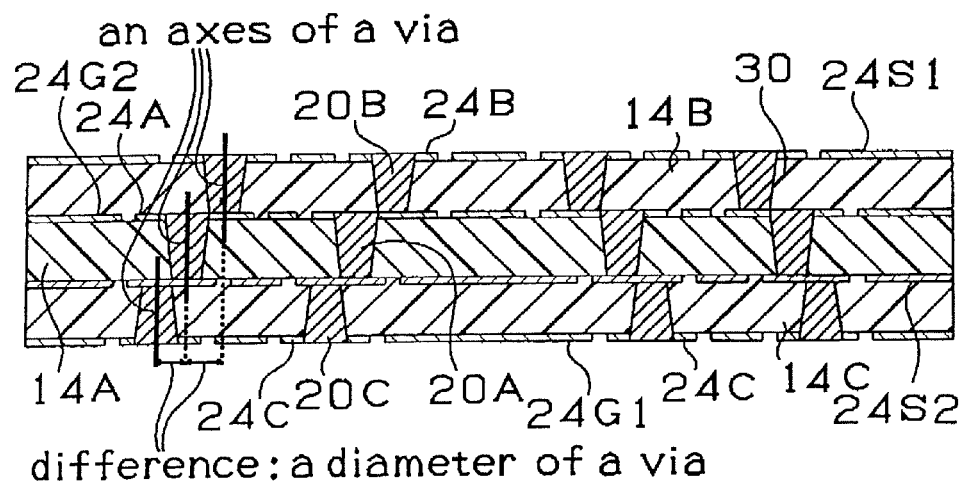

For a layer structure of the multilayered core substrate, as shown in FIG. 13(B), signal layers (24S1, 24S2) and ground layers (24G1, 24G2) may be arranged alternately. This makes it easier to improve the electrical characteristics of the core substrate.

Also, if required, as shown in FIG. 13(A), capacitor (C) (including a dielectric layer), resistor (R), and/or an inductor (not shown in the illustration) may be built into the multilayered core substrate. This makes it easier to improve electrical characteristics. By using a multilayered core substrate for these, electrical characteristics are more easily stabilized (for example, inductance can be stabilized).

Figure 2:
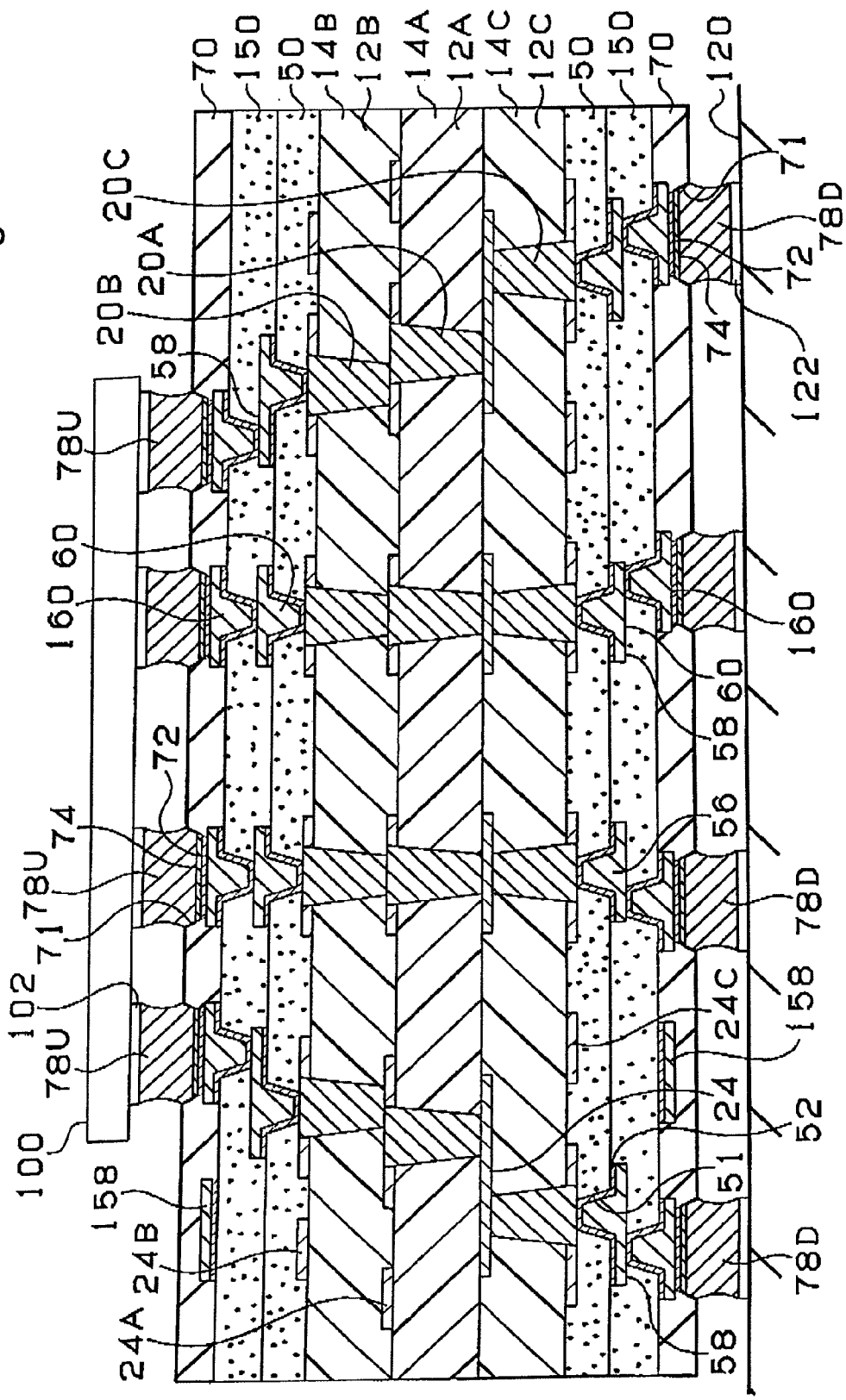
FIG. 2 is a cross-sectional view illustrating the multilayered PWB shown in FIG. 1 with a mounted IC chip.

Referring to FIGS. 1-2, the structure of a multilayered PWB 10 according to an embodiment of the present invention is described. FIG. 1 is a cross-sectional view illustrating a multilayered PWB 10 according to an embodiment of the present invention. FIG. 2 is a view illustrating multilayered PWB 10 as shown in FIG. 1 having IC chip 100 and mounted on daughter board 120. As shown in FIG. 1, in multilayered PWB 10 conductive circuits (24B, 24C) are formed on the surfaces of multilayered core substrate 30. The top and bottom surfaces of multilayered core substrate 30 are connected through via holes (20B, 20A, 20C). On multilayered core substrate 30, interlaminar resin insulation layer 50, having via holes 60 and conductor circuits 58, and interlaminar resin insulation layer 150, having via holes 160 and conductor circuits 158, are provided. On top of the layer with via holes 160 and conductor circuits 158, solder-resist layer 70 is formed. Openings 71 are formed in solder-resist layer 70. On the top surface of the multilayered PWB, solder bumps (78U) are formed via openings 71. On the bottom surface, solder bumps (78D) are formed. As shown in FIG. 1, openings are formed to expose via holes 160, but openings may be formed to include portions of via holes 160 and conductor circuits 158.

As shown in FIG. 2, solder bumps (78U) on the top surface of multilayered PWB 10 are connected to electrodes 102 on IC chip 100, and solder bumps (78D) on the bottom surface are connected to lands 122 on daughter board 120.

In the following, a method for manufacturing a multilayered PWB according to this embodiment of he present invention is described.

(1) First, a circuit substrate is prepared as a structural unit for multilayered core substrate 30 in a multilayered PWB. This circuit substrate becomes the center substrate on which multiple insulation layers are laminated. By laminating copper foils and a B-stage prepreg prepared by impregnating glass cloth with epoxy resin, and then thermal-pressing them, double-sided copper-laminated layer (12A) is obtained to use as a starting material (see FIG. 3(A)). The thickness of the above insulation base material (14A) is 60 μm, and the thickness of copper foil (16A) is 12 μm. A copper foil thicker than 12 μm may be used for the laminated layer, and its thickness may be adjusted to 12 μm by etching.

(2) On double-sided circuit substrate (12A) having copper foil (16A), a $CO_2$ laser is irradiated to penetrate through copper foil (16A) and insulation substrate (14A) and reaches the copper foil on the other surface to form via-hole openings (18A). After that, openings formed by the laser process may be desmeared with a permanganate solution (see FIG. 3(B)). In this example, for the formation of via-hole openings (18A), using a $CO_2$ laser processing apparatus having high peak and short pulse made by Hitachi Via Mechanics, Ltd., directly on a 60 μm-thick glass cloth-epoxy resin base material with a laminated 12 μm-thick copper foil, a laser is irradiated under the following conditions to form openings (18A) of 75 μmφ at a rate of 100 openings per second.

Openings (18A) formed under such conditions are substantially truncated, having a tapering angle (inner angle) of 65 degrees with respect to the surface of insulation base material (14A).

Figure 3:
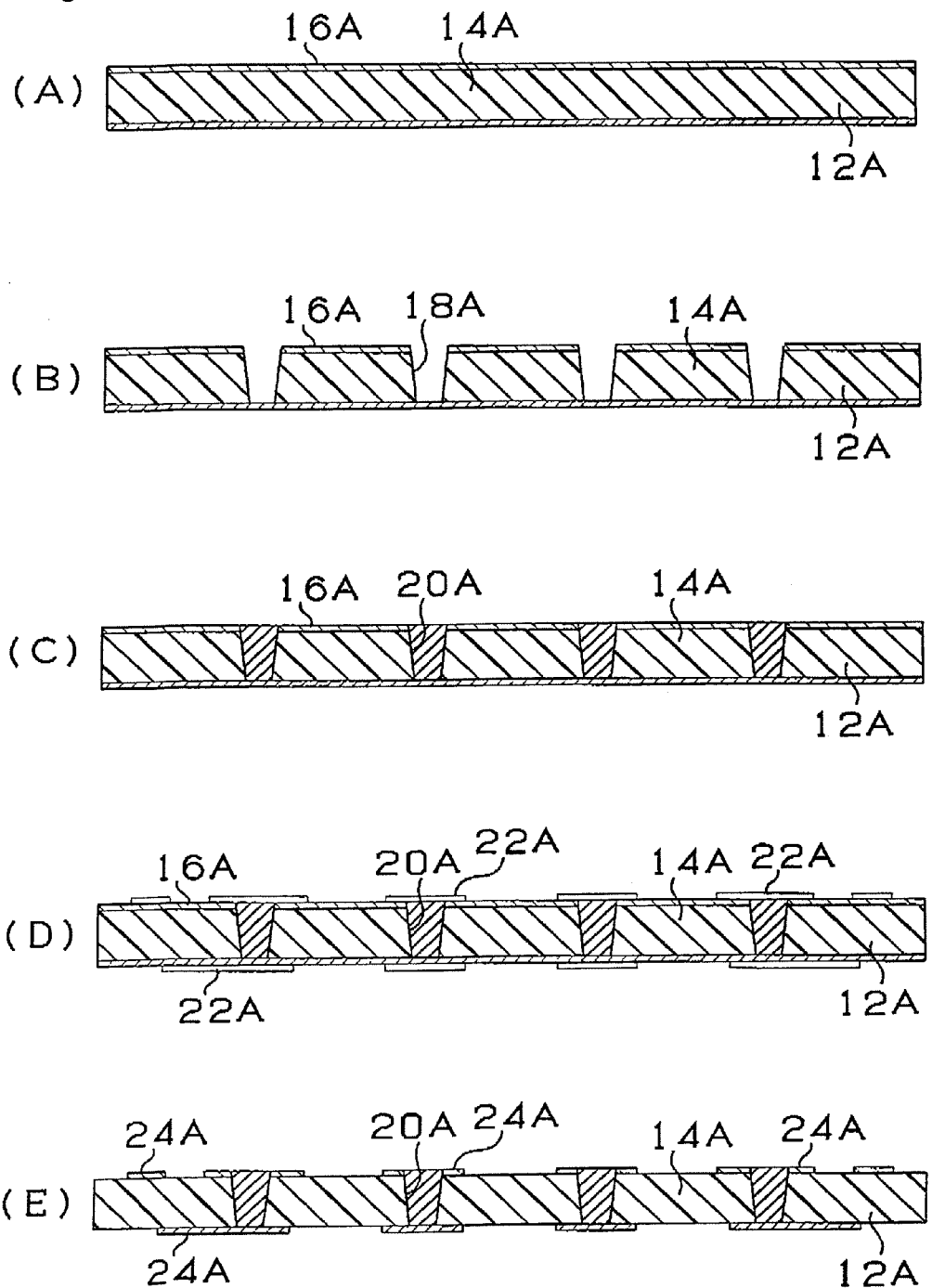
FIGS. 3(A)-3(E) are views illustrating steps for manufacturing a multilayered PWB according to the embodiment shown in FIGS. 1 and 2.

[Laser Processing Conditions]
pulse energy: 0.5-100 mJ
pulse width: 1-100 μs
pulse interval: 0.5 ms or longer
number of shots: 2
oscillation frequency: 2,000-3,000 Hz (3) On the surface of copper foil (16A) having desmeared via-hole openings (18A), electrolytic copper plating is performed under the following conditions using a copper foil as plating lead to form an electrolytic copper plating film (see FIG. 3(C)).
[Electrolytic Plating Solution]
sulfuric acid: 2.24 mol/l
copper sulfate: 0.25 mol/l
additive A (reaction accelerating agent): 10.0 ml/l
additive B (reaction suppressing agent): 10.0 ml/l
[Electrolytic Plating Conditions]
current density: 1.1 A/dm$^2$
time: 65 minutes
temperature: 22±2° C.

By additive A, the formation of electrolytic copper-plated films inside via-hole openings is accelerated, but by additive B, plating is mainly adhered to the copper foil and the formation of electrolytic copper-plated films is suppressed. When the via-hole openings are filled completely with electrolytic copper plating and the surfaces of the openings reach the same level with the copper foil surface, additive B is adhered and the further formation of electrolytic copper plating is suppressed as it is suppressed on the copper foil portion. Accordingly, via holes (20A) are formed where openings (18A) are filled with electrolytic copper plating. The top surfaces of via holes (20A) are at substantially the same level as the copper foil surface. Also, copper foil (16A) and the conductor layer made of electrolytic copper-plated film may be etched to adjust its thickness. If required, the conductor layer thickness may be physically adjusted by sander-belt polishing or buff polishing.

(4) At both surfaces of the substrate prepared according to the above step (3), on the conductor layer including copper foil (16A) and electrolytic copper plating film, a 15-20 μm-thick resist layer of a photosensitive dry film is formed. A mask having a printed conductor circuit pattern including lands for via holes is placed on the resist layer, which is then exposed to light and developed to form etching resist layer (22A) (see FIG. 3(D)). Then, copper foil (16A) and the electrolytic copper-plated film, which are exposed by the portions where the etching resist is not formed, are dissolved and removed by an etching process using an etching solution of hydrogen peroxide/sulfuric acid.

(5) After that, etching resist (22A) is removed using an alkali solution to form conductor circuit pattern (24A), which includes via-hole lands. Accordingly, via holes (20A) electrically connecting conductor circuits on the top and bottom surfaces of the substrate are formed, A circuit substrate with via holes (20A) and portions of the copper foil, where conductor circuits (24A) are formed, are made flat is obtained (see FIG. 3(E)).

Figure 4:
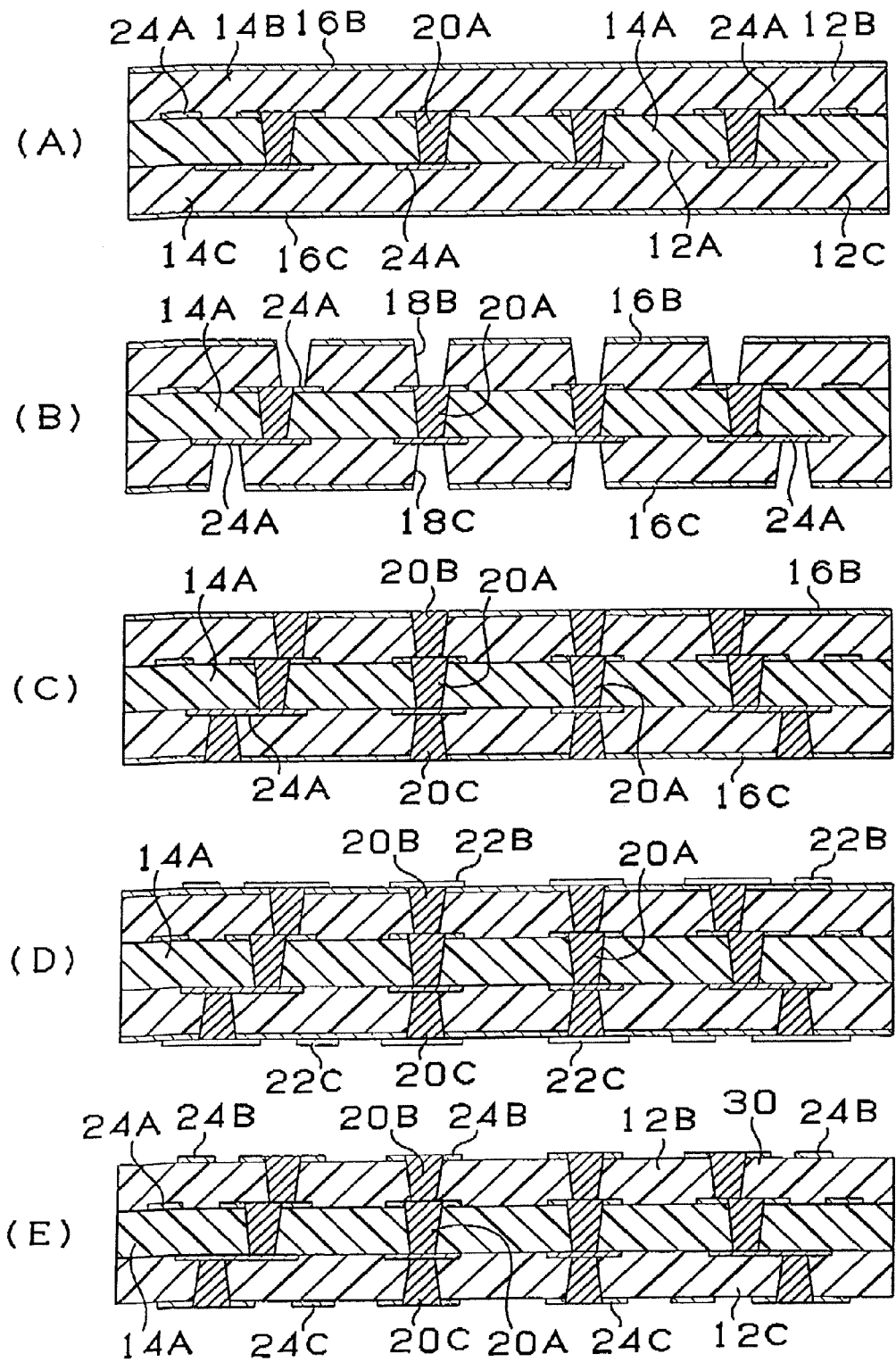
FIGS. 4(A)-4(E) are views illustrating steps for manufacturing a multilayered PWB according to the embodiment shown in FIGS. 1 and 2.

(6) On the top and bottom surfaces of the circuit substrate obtained according to the above steps (1)-(5), a 60 μm-thick B-stage prepreg, prepared by impregnating glass cloth with epoxy-resin, and a 12 μm-thick copper foil are laminated and thermal-pressed at a temperature in the range of 80-250° C. and a pressure in the range of 1.0-5.0 kgf/cm$^2$ to form 60 μm-thick resin insulation layers (14B, 14C) as well as 12 μm-thick conductor layers (16B, 16C) (see FIG. 4(A)).

(7) Then, by using almost the same step as the above step (2), and under the following conditions, a CO$_2$ gas laser is irradiated on both surfaces of the substrate at a rate of 100 openings per second to form via-hole openings (18B, 18C) with a 65 μm diameter. The via-hole openings are formed through resin insulation layers (14B, 14C) and conductor layers (16B, 16C) and reach conductor circuit (24A) on the lower layer. Then, the openings formed by the above laser process are desmeared with a permanganate solution (see FIG. 4(B)).

The shape of openings (18B, 18C) formed under such conditions is substantially truncated, the inner walls of the openings having a tapering angle (inner angle) of 65 degrees with respect to the surfaces of resin insulation layers (14B, 14C).
[Laser Processing Conditions]
pulse energy: 0.5-100 mJ
pulse width: 1-100 μs
pulse intervals: 0.5 ms or longer
number of shots: 2
oscillation frequency: 2,000-3,000 Hz (8) In a procedure substantially similar to the above step (3), on the surface of conductor layers (16B, 16C) where the desmeared via-hole openings are formed, an electrolytic copper plating process under the following conditions is performed to form an electrolytic copper-plated film (see FIG. 4(C)).
[Electrolytic Plating Liquid]
sulfuric acid: 2.24 mol/l
copper sulfate: 0.25 mol/l
additive A (reaction accelerating agent): 10.0 ml/l
additive B (reaction suppressing agent): 10.0 ml/l
[Electrolytic Plating Conditions]
current density: 1.1 A/dm$^2$
duration: 65 minutes
temperature: 22±2° C.

Accordingly, the interior of openings (18B, 18C) is filled with electrolytic copper plating to form via holes (20B, 20C). The surfaces of via holes (20B, 20C) and the copper foil surface are made substantially the same level.

(9) In a procedure substantially similar to the above step (4), on the electrolytic copper-plated film obtained in the above step (8), a resist made of a photosensitive dry film is formed to be 15-20 μm thick. On the resist, a mask having a printed pattern of a conductor circuit and lands for via holes (20B, 20C) or the like is placed, the substrate is aligned by recognizing the second alignment mark by a camera, and then the resist is exposed to light and developed to form etching resist layers (22B, 22C) (see FIG. 4(D)). Then, on the area where the resist is not formed, etching is performed using an etching solution of hydrogen peroxide/sulfuric acid to remove the copper-plated film and copper film corresponding to the area where the resist is not formed.

(10) Then, etching resist layers (22B, 22C) are removed using an alkali solution to form conductor circuits (24B, 24C), including via holes (20B, 20C) and their lands. Accordingly, a circuit substrate in which via holes (20B, 20C), which electrically connect the top and bottom surfaces of the substrate, and portions of the copper foil, which form conductor circuits (24B, 24C), are made flat is obtained (see FIG. 4(E)).

Accordingly, a multilayered core substrate having multiple insulation layers (12B, 12C) and conductor circuits (24B, 24C) on both surfaces of double-sided circuit substrate (12A) is obtained. Namely, multilayered core substrate 30, having three (3) insulation layers and four (4) conductor circuits, is formed. Via holes (20A, 20B), formed in double-sided circuit substrate (14A) and insulation layer (14B) laminated on the top surface of substrate (14A), make up the first via group which are truncated in shape with a tapering angle of 65 degrees with respect to the surface of the insulation layer. Via holes (20C), formed in insulation layer (14C) laminated on the bottom surface of the double-sided circuit substrate, make up the second via group, which are also truncated in shape with a tapering angle of 65 degrees with respect to the surface of the insulation layer.

(11) In the following, interlaminar insulation layers are formed on multilayered core substrate 30. First, a roughened layer is formed on the surfaces of conductor circuits (24B, 24C) by an etching process. Then, on both surfaces of multilayered core substrate 30, a resin film for an interlaminar resin insulation layer slightly larger than the substrate is placed. Then, under conditions calling for a pressure of 0.45 MPa, temperature of 80° C. and pressing time of 10 seconds, the resin film is preliminarily pressed and cut out. After that, using the procedure below, interlaminar resin insulation layer 50 is formed using vacuum laminator apparatus (FIG. 5(A)). Namely, the resin film for the interlaminar resin insulation layer is pressed on the substrate under conditions calling for vacuum degree at 67 Pa, pressure of 0.4 MPa, temperature of 85° C. and pressing time of 60 seconds, and then thermoset at 170° C. for 40 minutes.

Figure 5:
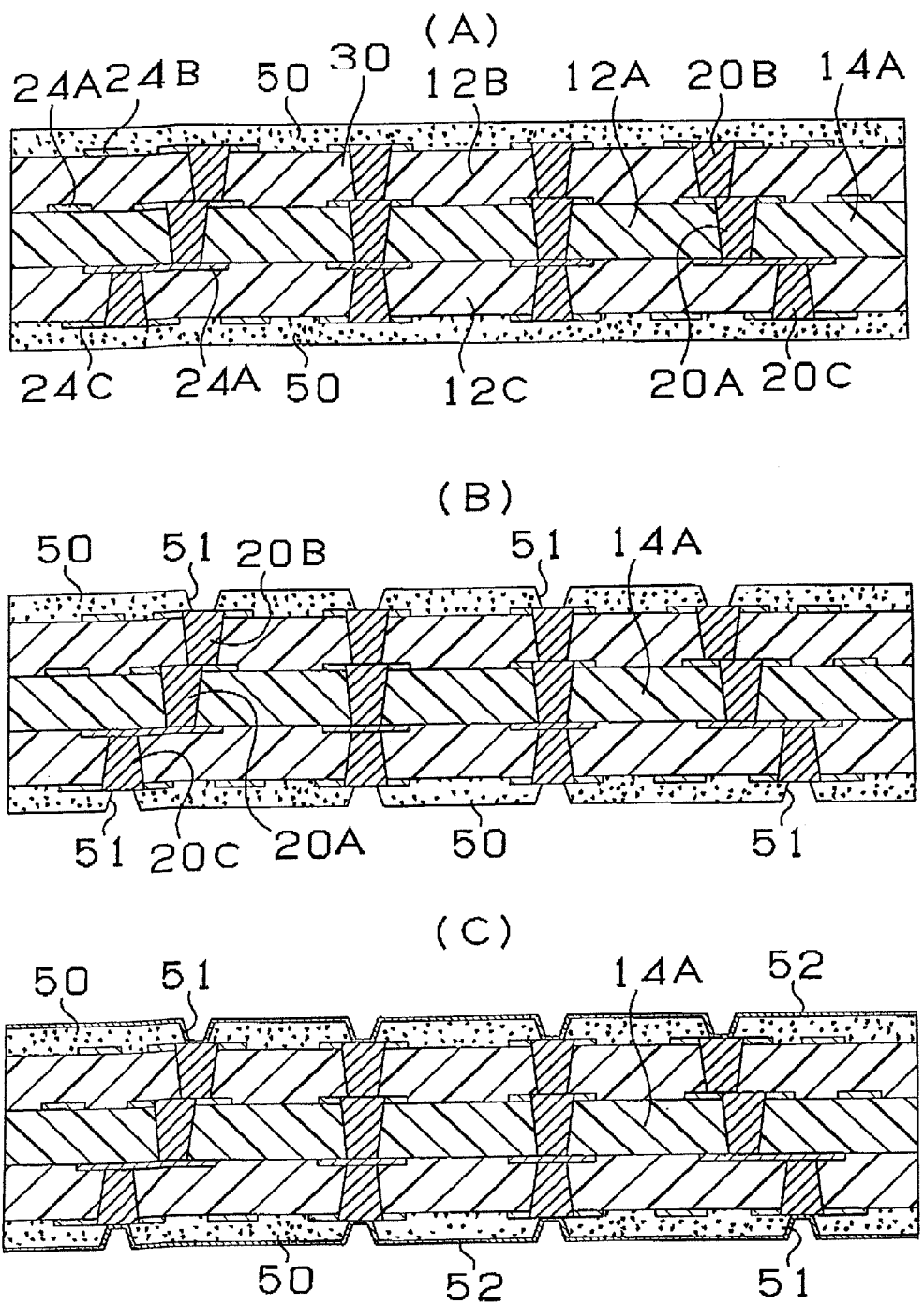
FIGS. 5(A)-5(C) are views illustrating steps for manufacturing a multilayered PWB according to the embodiment shown in FIGS. 1 and 2.

(12) Next, via-hole openings 51 are formed in interlaminar resin insulation layer 50 by using a $CO_2$ gas laser with a 10.4 μm-wavelength under conditions of beam diameter 4.0 mm, top-hat mode, pulse width 3-30μ second, through-hole diameter of mask 1.0-5.0 mm and number of shots 1-3 (FIG. 5(B)).

(13) By immersing the substrate having via-hole openings 51 for 10 minutes in an 80° C. solution, containing 60 g/l of potassium permanganate, particles on the surface of interlaminar resin insulation layers 50 are removed. Accordingly, on the surface including inner walls of via-hole openings 51, roughened surfaces are formed (not shown in the illustration).

(14) Next, after the above procedure, the substrate is immersed in a neutralizer (made by Shipley) and washed with water. Further, on the roughened surfaces of the above substrate (a surface roughness of 3 μm in depth), a palladium catalyst is applied to adhere catalytic nuclei to the surfaces of interlaminar resin insulation layers and inner walls of via-hole openings. Namely, the above substrate is immersed in a liquid catalyst containing palladium chloride ($PbCl_2$) and stannous chloride ($SnCl_2$), the palladium metal is extracted, and the catalyst is deposited.

(15) Next, in an electroless copper-plating solution (Thru-Cup PEA made by C. Uyemura & Co., Ltd.), the substrate with deposited catalyst is immersed to form an electroless copper-plated film with a thickness in the range of 0.3-3.0 μm on the entire roughened surfaces. Accordingly, a substrate in which electroless copper-plated films 52 are formed on the surfaces of interlaminar resin insulation layers 50, including the inner walls of via-hole openings 51, is obtained (FIG. 5(C)).
[Electroless Plating Conditions]
for 45 minutes at a liquid temperature of 34° C.

Figure 6:
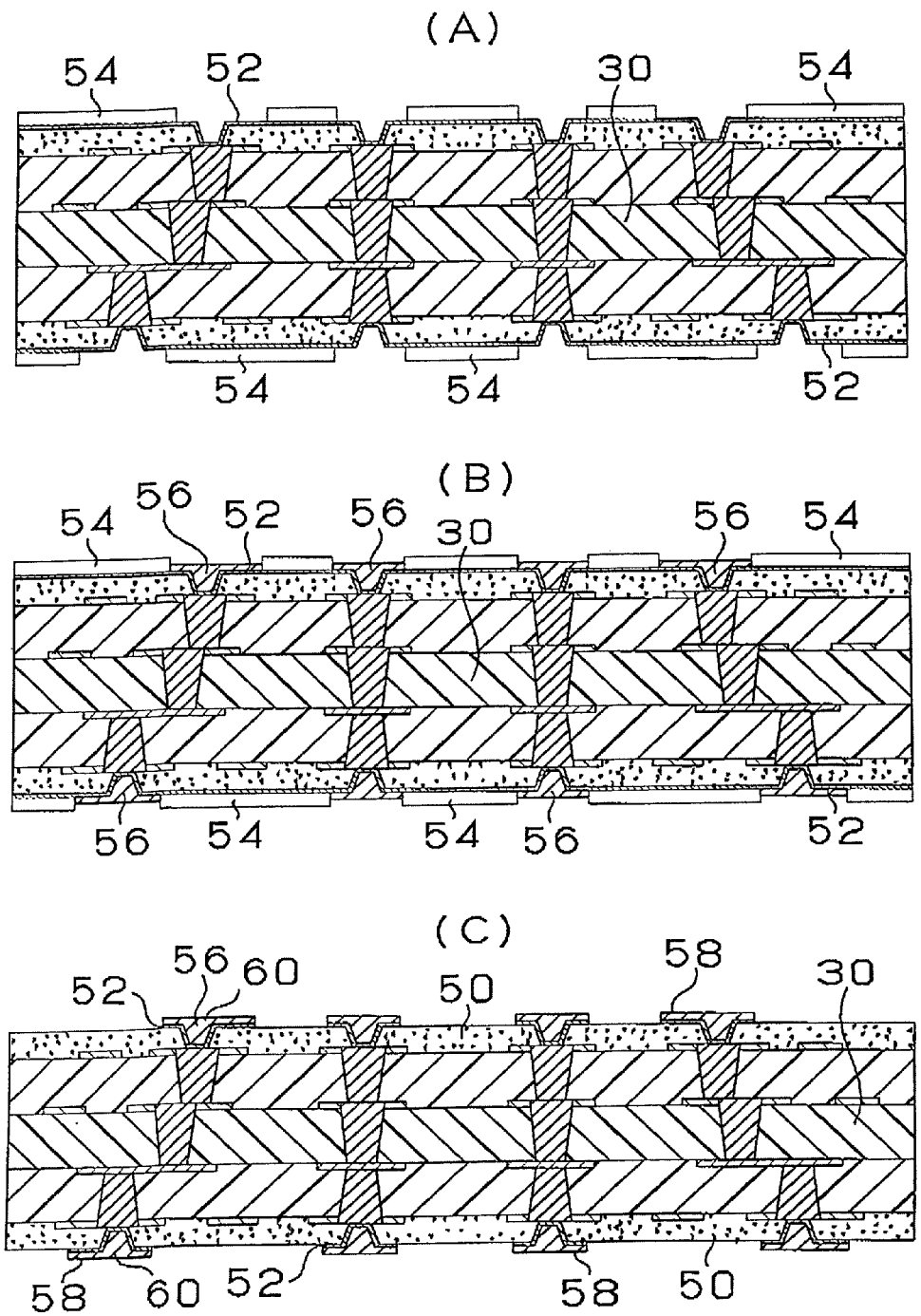
FIGS. 6(A)-6(C) are views illustrating steps for manufacturing a multilayered PWB according to the embodiment shown in FIGS. 1 and 2.

(16) On the substrate having electroless copper-plated films 52, a commercially available photosensitive dry film is laminated, and a mask is placed on the film, which is then exposed to light at 110 mJ/$cm^2$ and developed using a 0.8% sodium carbonate solution, to form 25 μm-thick plating resists 54 (FIG. 6(A)).

(17) Next, after the substrate is cleaned with 50° C. water to remove grease and washed with 25° C. water, it is further rinsed with sulfuric acid. Then, electrolytic plating is performed under the following conditions to form 15 μm-thick electrolytic copper-plated films 56 in areas where plating resists 54 are not formed (FIG. 6(B)).
[Electrolytic Plating Liquid]
sulfuric acid: 2.24 mol/l
copper sulfate: 0.25 mol/l
additive: 19.5 ml/l
(Cupracid GL, Made by Atotech Japan)
[Electrolytic Plating Conditions]
current density: 1.1 A/$dm^2$
time: 70 minutes
temperatures: 22±2° C.

(18) Furthermore, after plating resists 54 are removed using a 5% KOH solution, the electroless plated films under the plating resists are dissolved and removed in an etching process using a mixed solution of sulfuric acid and hydrogen peroxide to form independent conductor circuits 58 and via holes 60 (FIG. 6(C)). Then, through a process similar to the above step (11), roughened surfaces are formed on conductor circuits 58 and via holes 60 (not shown in the illustration).

Figure 7:
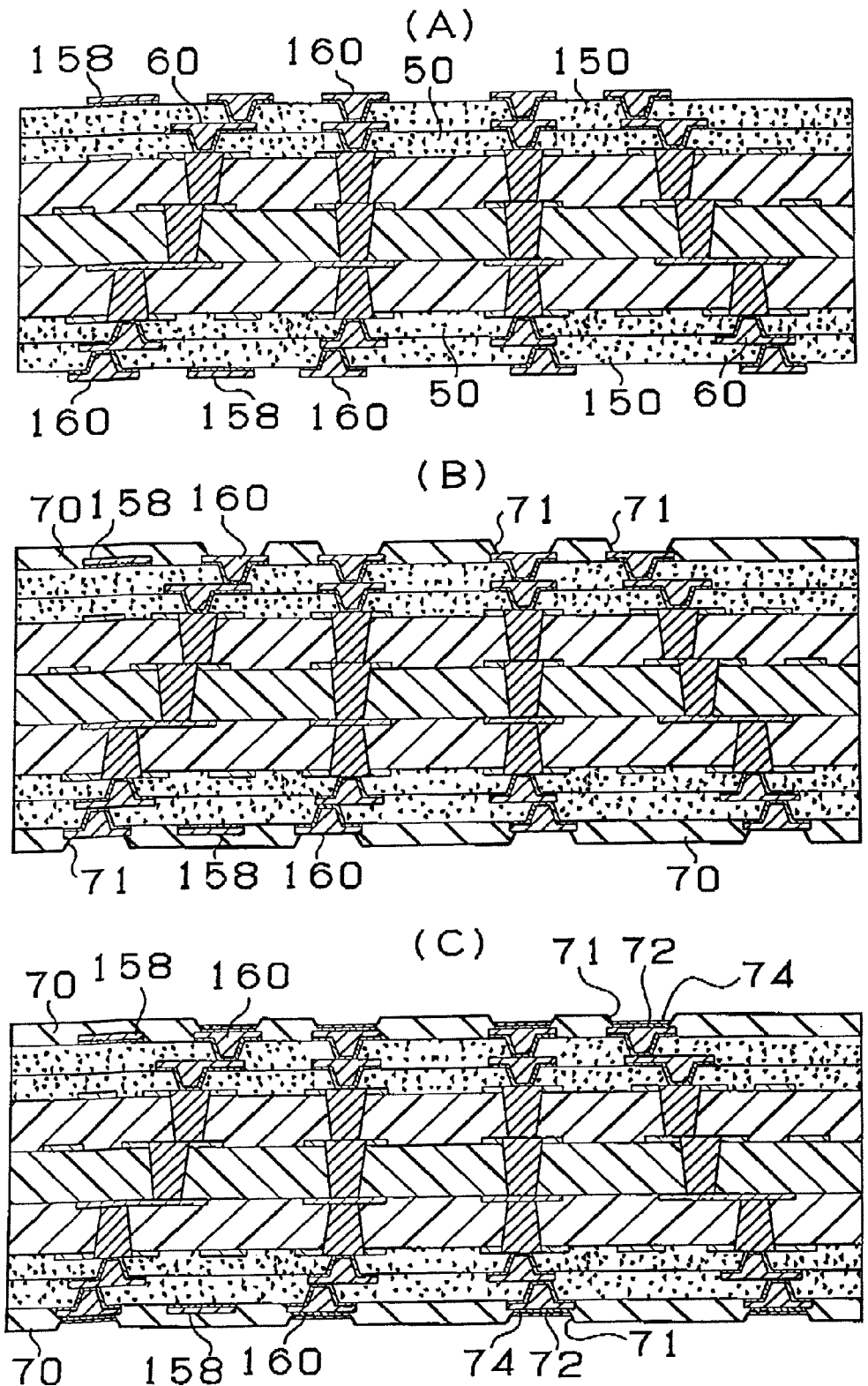
FIGS. 7(A)-7(C) are views illustrating steps for manufacturing a multilayered PWB according to the embodiment shown in FIGS. 1 and 2.

(19) By repeating the above steps (11)-(18), interlaminar insulation layers 150 having further upper conductor circuits 158 and via holes 160 are formed, thereby producing a multilayered PWB (FIG. 7(A)).

(20) Next, on both surfaces of the multilayered PWB, commercially available solder-resist composition 70 is coated 20 μm thick. After that, a drying process at 70° C. for 20 minutes and 70° C. for 30 minutes is conducted. A 5 mm-thick photo-mask having a printed pattern of solder-resist openings is attached to solder-resist layers 70, which are then exposed to ultraviolet light at 1,000 mJ/$cm^2$, developed using a DMTG solution to form openings 71 with a 105 μm diameter on the top surface, and openings 71 with a 200 μm diameter on the bottom surface (FIG. 7(B)). Furthermore, solder-resist layers 70 are each thermoset by heat-processing under condition of 80° C. for an hour, 100° C. for an hour, 120° C. for an hour, and 150° C. for three hours to form solder-resist pattern layers having openings with a thickness in the range of about 15-25 μm.

(21) Next, a substrate having solder-resist layers 70 is immersed for 20 minutes in an electroless nickel plating liquid at pH=4.5, containing nickel chloride ($2.3 \times 10^{-1}$ mol/l), sodium hypophosphite ($2.8 \times 10^{-1}$ mol/l) and sodium citrate ($1.6 \times 10^{-1}$ mol/l), to form 5 μm-thick nickel-plated layers 72 in openings 71, (71S), (71P). Then, the substrate is further immersed for 7.5 minutes under conditions of 80° C. in an electroless gold plating liquid containing gold potassium cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l) to form 0.03 μm-thick gold-plated layers 74 on nickel-plated layers 72 (FIG. 7(C)). Other than the nickel-gold layers, single layers of tin or noble metals (such as gold, silver, palladium, or platinum) may be formed.

(22) After that, solder balls are mounted inside openings 71 and fused by a reflow process at 230° C. Accordingly, solder bumps (78U) are formed in openings 71 on the top surface, and solder bumps (78D) are formed in openings 71 on the bottom surface (FIG. 1).

IC chip 100 is mounted on multilayered PWB 10, and by conducting a reflow process, electrodes 102 of IC chip 100 are connected via solder bumps (78U). Then, multilayered PWB 10 is mounted on daughter board 120 via external connection terminals (such as BGA, PGA, LGA and solder bumps) (FIG. 2).

Figure 11:
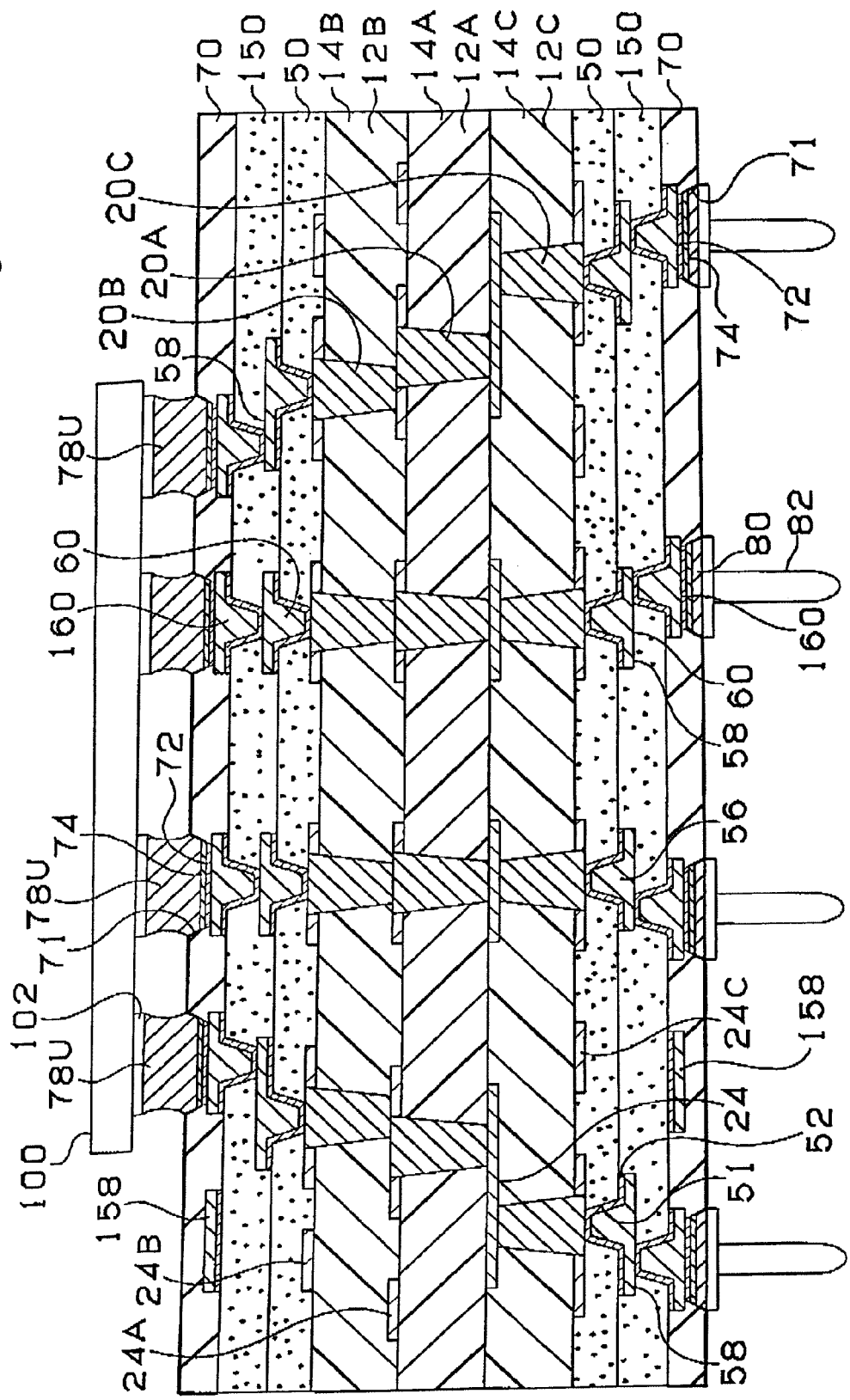
FIG. 11 is a cross-sectional view of a multilayered PWB according to still another embodiment of the present invention.

With reference to FIG. 1, multilayered PWB 10 is mounted on a daughter board via solder bumps (78D). However, as illustrated in FIG. 11, conductive connection pins 82 may be formed and the multilayered PWB can be connected to the sockets formed on a daughter board via conductive connection pins 82.

Figure 8:
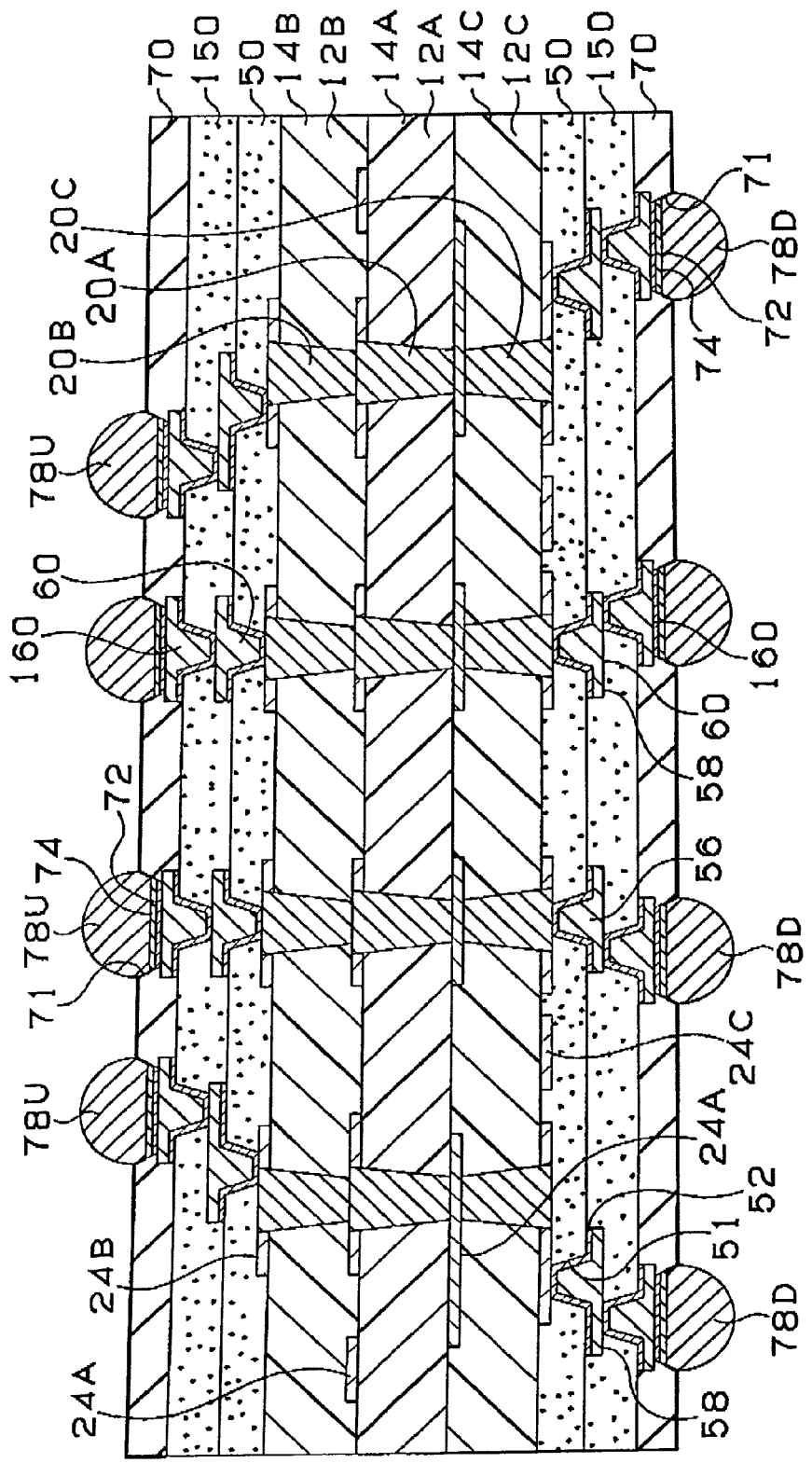
FIG. 8 is a cross-sectional view illustrating a multilayered PWB according to another embodiment of the present invention.

FIG. 8 is a cross-sectional view illustrating a multilayered PWB according to another embodiment of the present invention.

In the embodiment described above with reference to FIG. 1, regarding via holes (20B, 20C, 20A) formed in the multilayered core substrate, some are stacked along a straight line and some are shifted in a direction substantially perpendicular to a direction along the thickness of the insulation layers. By comparison, in the present embodiment, all via holes (20B, 20C, 20A) are aligned along straight lines.

Figure 9:
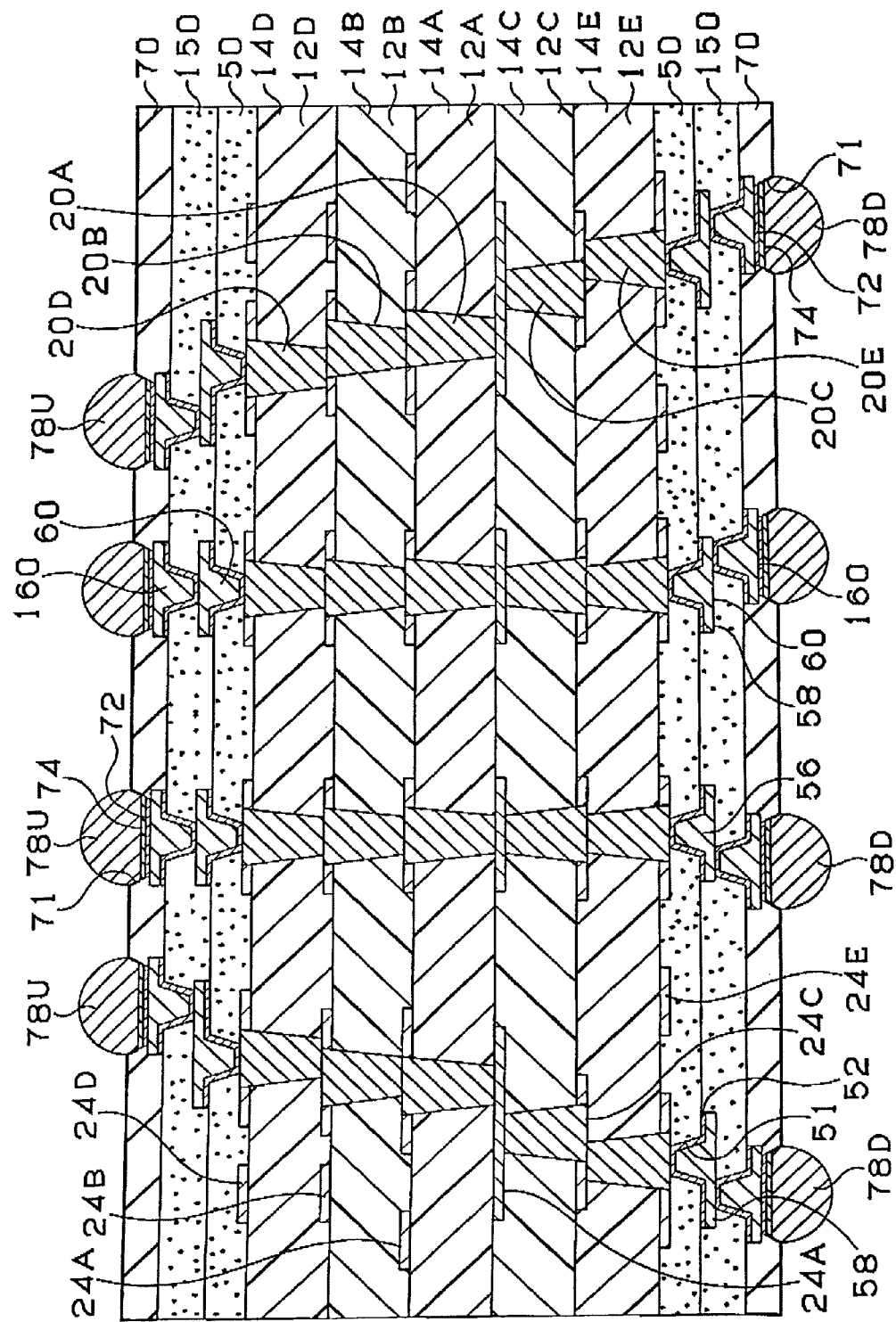
FIG. 9 is a cross-sectional view illustrating a multilayered PWB according to yet another embodiment of the present invention.

FIG. 9 is a cross-sectional view illustrating the multilayered PWB according to yet another embodiment of the present invention.

In the embodiment described above with reference to FIG. 1, a multilayered core substrate is structured with one of insulation layers (14B, 14C) and one of conductor circuits (16B, 16C) formed on each surface of double-sided circuit substrate (12A). By comparison, in the present embodiment, two of insulation layers (14B, 14C, 14E, 14D) and two of conductive circuits (16B, 16C, 16E, 16D) are formed on each surface of double-sided circuit substrate (12A).

Namely, a multilayered core substrate having five (5) insulation layers and six (6) conductor circuits is formed. Via holes (20B, 20D) formed in a double-sided circuit substrate (12A) and in two insulation layers (14B, 14D), which are laminated over substrate (12A), make up the first via group, and are truncated in shape with a tapering angle of 65 degrees with respect to the insulation layer surfaces. Via holes (20C, 20E) formed in two insulation layers (14C, 14E), which are laminated below double-sided circuit substrate (12A), make up the second via group, and are truncated in shape with a tapering angle of 65 degrees with respect to the insulation layer surfaces. The first and second via groups are laminated facing each other.

Figure 10:
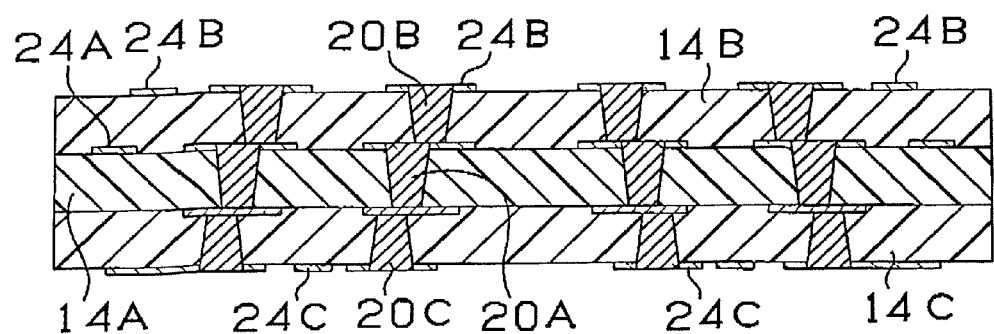
FIGS. 10(A) and 10(B) are cross-sectional views illustrating multilayered core substrates of multilayered PWBs according to still other embodiments of the present invention.
Figure 10:
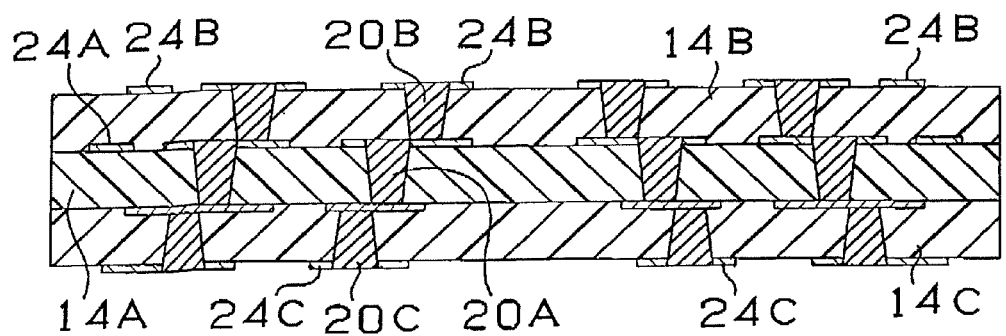

In still another embodiment of the present invention, as shown in FIG. 10(A), a multilayered PWB is obtained by forming a multilayered core substrate by following steps similar to those described in the embodiment referring to FIGS. 1 and 2, except that via holes (20B) of the first via group, which are formed in insulation layer (14B) laminated on the top side of the multilayered core substrate in the multilayered PWB, and via holes (20C) of the second via group, which are formed in insulation layer (14C) laminated on the bottom side of the substrate, are shifted approximately a half diameter away from corresponding via holes (20A), which are formed in the center insulation layer (14A).

In still another embodiment of the present invention, as shown in FIG. 10(B), a multilayered PWB is obtained by forming a multilayered core substrate by following steps similar to those described in the embodiment referring to FIGS. 1 and 2, except that via holes (20B) of the first via group, which are formed in insulation layer (14B) laminated on the top side of the multilayered core substrate in the multilayered PWB, and via holes (20C) of the second via group, which are formed in insulation layer (14C) laminated on the bottom side, are shifted a full diameter away from corresponding via holes (20A), which are formed in the center insulation layer (14A).

In still another embodiment of the present invention, a multilayered PWB is obtained by forming a multilayered core substrate by following steps similar to those described in the embodiment referring to FIGS. 1 and 2, except that by laminating two (2) insulation layers on the top side of the above double-sided circuit substrate and one (1) insulation layer on the bottom side of the double-sided circuit substrate, a multilayered PWB having four (4) insulation layers and five (5) conductive circuits is formed.

In still another embodiment of the present invention, a multilayered PWB is obtained by forming a multilayered core substrate by following steps similar to those described in the embodiment referring to FIG. 10(A), except that by laminating two (2) insulation layers on the top side of the above double-sided circuit substrate and one (1) insulation layer on the bottom side of the double-sided circuit substrate, a multilayered PWB having four (4) insulation layers and five (5) conductive circuits is formed.

In still another embodiment of the present invention, a multilayered PWB is obtained by forming a multilayered core substrate by following steps similar to those described in the embodiment referring to FIG. 10(B), except that by laminating two (2) insulation layers on the top side of the above double-sided circuit substrate and one (1) insulation layer on the bottom side of the double-sided circuit substrate, a multilayered PWB having four (4) insulation layers and five (5) conductive circuits is formed.

Figure 12:
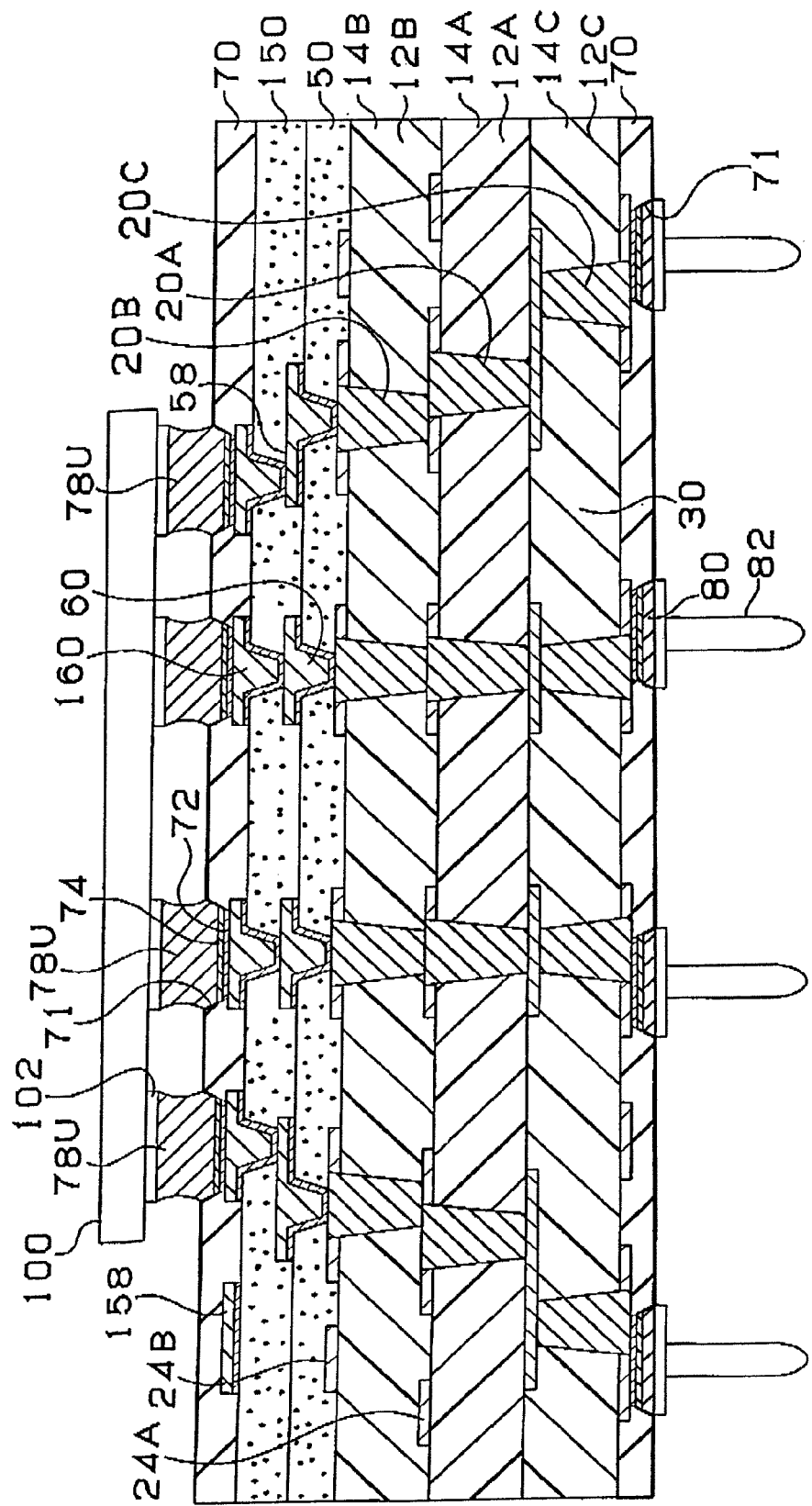
FIG. 12 is a cross-sectional view illustrating a multilayered PWB according to still another embodiment of the present invention.

Regarding the multilayered PWB described with reference to FIG. 1, insulation layers and conductor circuits are formed on both surfaces of the multilayered core substrate. In still another embodiment of the present invention, as shown in FIG. 12, only on one surface of multilayered core substrate 30, interlaminar insulation layers 50, 150 and conductor circuits 58, 158 are formed.

In still another embodiment of the present invention, as shown in FIG. 13(A), chip capacitor (C) and resistor (R) are built into multilayered core substrate 30.

In still another embodiment of the present invention, as illustrated in FIG. 13(B), on the top side layer of multilayered core substrate, signal layer (24S1) is formed, and on the inner-layer laminated on the bottom side of inner insulation layer (14A), signal layer (24S2) is formed. On the bottom surface of multilayered core substrate 30, ground layer (24G1) is formed, and on the inner-layer laminated on the top side of inner insulation layer (14A), ground layer (24G2) is formed. In this embodiment, by forming ground layers in multilayered core substrate 30, electrical characteristics are improved in the multilayered PWB.

In a multilayered PWB according to the embodiments of the present invention, a multilayered core substrate has multiple insulation layers, and conductor layers laminated on the insulation layers are electrically connected with each other through via holes. It is preferred to use at least three insulation layers. By such, via holes may be stacked to have the core substrate connected substantially in a straight line, or layer by layer through conductor circuits or via holes to shift toward the periphery of the substrate, as required. Namely, wiring flexibility in the core substrate can be ensured. Further, by using a multilayered core substrate in the multilayered PWB for IC packaging, via holes may be structured facing each other. With such a structure, wiring flexibility or tolerance to warping can be ensured. Furthermore, the number of insulation layers in a multilayered core substrate may be 2N+1 (N being a natural number). Since the insulation layer formed at number N becomes the center of the core substrate, and the same number of insulation layers will be laminated on both surfaces, the rigidity of the core substrate can be ensured.

For the insulation layers or insulation substrates in a core substrate according to the embodiments of the present invention, insulation material with impregnated core material is preferably used. By using such material, the rigidity of the insulation layers to form the core substrate is ensured. In addition, even if the insulation layers are prepared thinner than a certain thickness, via holes can be formed therein, and interlaminar connections can be conducted accordingly.

As insulation material with impregnated core material, for example, rigid lamination base material may be selected from glass cloth-epoxy resin base material, phenol resin base material, glass cloth-bismaleimide triazine resin base material, glass cloth-polyphenylene ether resin base material, alamide non-woven fabric-epoxy resin base material, or alamide non-woven fabric-polyimide resin base material. Other insulation material used for PWBs may also be used. The thickness of such an insulation resin or insulation base material is preferably approximately 250 µm or less; more preferably, approximately 100 µm or less. As such, the total thickness of a multilayered core substrate can be less, and the electrical characteristics (such as impedance) through the multilayered core substrate can be ensured.

A circuit substrate, prepared by forming conductor circuits on one or both surfaces of such an insulation layer or an insulation substrate, is used as the lamination center and on the circuit substrate surfaces, insulation layers and conductor layers are alternately laminated to form a multilayered core substrate. In addition, by making the thickness of each insulation layer or insulation substrate to approximately 250 µm or less, the total thickness of a multilayered core substrate itself can be thin.

Also, a multilayered core substrate according to the embodiments of the present invention can ensure its electrical connectivity by using conductive material to form via holes that connect insulation layers. As for the conductive material, either a plating process, conductive pastes, soldering material or a conductive layer mass may be used. Among those, a plating process is preferred. Conductive material listed above may be used singly or in combination of two or more for ensured conductivity.

Via holes may be completely filled with conductive material (so-called filled via) or partially filled, or a combination thereof.

The plated film used to form the above via holes may be formed through an electrolytic plating or electroless plating process. Metals to be used may be a single metal such as copper, nickel, iron or cobalt, or an alloy made mainly with those metals.

In addition, the via-hole diameter is preferably approximately 150 µm or smaller. By such, dense wiring structures in a multilayered core substrate can be obtained and its electrical characteristics may also be ensured.

A multilayered core substrate may have a stacked-via structure, for example, a stacked via structure having three layers or more. As such, a stacked via structure may pass completely through a multilayered core substrate or a stacked via structure can partially pass through a multilayered core substrate. Also, the stacked via may be aligned along a straight line (along the axis of a stacked via structure), or roughly a straight line (indicating, for example, where the axis of a via hole is located within the diameter of another via hole). As long as the via holes are formed to be a stacked via structure, the electrical characteristics are ensured.

The thickness of a conductor circuit formed in a multilayered core substrate is preferably about 40 µm or less, more preferably about 25 µm or less.

Multiple stacked via according to the embodiments of the present invention as shown in FIG. 1 may be shaped tapering toward the bottom of the insulation layer where via holes are formed, or shaped tapering toward the surface of the insulation substrate or toward the conductor circuit formed thereon, or may be shaped widening from the inner surface toward the outer surface of a laminated insulation substrate.

For example, the via holes are preferably truncated, with the top surface wider than the bottom surface, in a truncated cone shape. Cross-sections of via holes (substantially a trapezoid shape) have preferably inner angles of tapering in the range of approximately 60-90 degrees. Within the above range, it is expected that the multiple stacked via structure can suppress warping without offsetting the anchoring effect.

The bottom diameter of via holes in the above multiple stacked via (hereinafter referred to as a "bottom via diameter") should be at least approximately 10 µm. When via holes are formed using a plating process, to form the plating film, a bottom via diameter is at least 10 µm. Accordingly, upper conductor layers (upper conductor circuits and via) and lower conductor circuits can be electrically connected.

In a multiple stacked via structure according to the embodiments of the present invention, it is preferred that the bottom surfaces of the via holes formed in an outer layer (upper layer via holes) almost exactly overlap with the bottom surfaces of the via holes formed in an inner layer (lower layer via holes). Namely, multiple via holes making up the first or second via group can be formed to align along substantially the same line.

Also, if the bottom surfaces of upper layer via holes may overlap at least partially with the bottom surfaces of lower layer via holes, the effects of the tapered shape can be achieved. Moreover, multiple via holes making up the first or second via group may be stacked shifting away or offsetting from each other in a direction that is substantially perpendicular to the thickness direction of the insulation layer or in a direction that is substantially perpendicular to the axial direction of a multiple stacked via structure, and the bottom surfaces of the via holes at least partially overlaps each other in the thickness direction of the insulation layer.

For example, as shown in FIG. 10(A), multiple via holes in the first or second via group may be stacked such that they are shifted or offset about one half of the via hole diameter away from each other. Also, as shown in FIG. 10(B), multiple via holes in the first or second via group may be stacked such that they are shifted or offset about a full via hole diameter away from each other.

Also, the first or second via group making up multiple stacked via structures according to the embodiments of the present invention is preferably formed by stacking via holes formed in an insulation substrate laminated with at least two or more layers. Namely, the first via group or second via group may be structured by stacking three, four or more layers of via holes.

Each stacked via, namely the first and second via groups, may have the same number of layers (for example, three layers in the first via group and three layers in the second via group) or a different number of layers (for example, two layers in the first via group and three layers in the second via group). By forming the first and second via groups of multiple stacked vias in opposite directions, electrical connections and reliability of a multilayered core substrate can be ensured.

Multiple stacked via structures according to the embodiments of the present invention may form conductor layers with electrical connections, but may also form dummy conductor layers without electrical connections. If a multiple stacked via structure is a dummy structure, other conductor layers which are not dummy structures (indicating conductor layers with electrical connections which are laid around the dummy conductor layer or other multiple stacked via structures facing the dummy structure) can provide similar effect.

Also, multiple stacked via in the first or second via group according to the embodiments of the present invention are, within the region where the conductor circuit is formed on each insulation substrate, preferably positioned substantially in the same area (along the same straight line), or arranged to maintain the shifted position each other (dispersed conditions).

Figure 14:
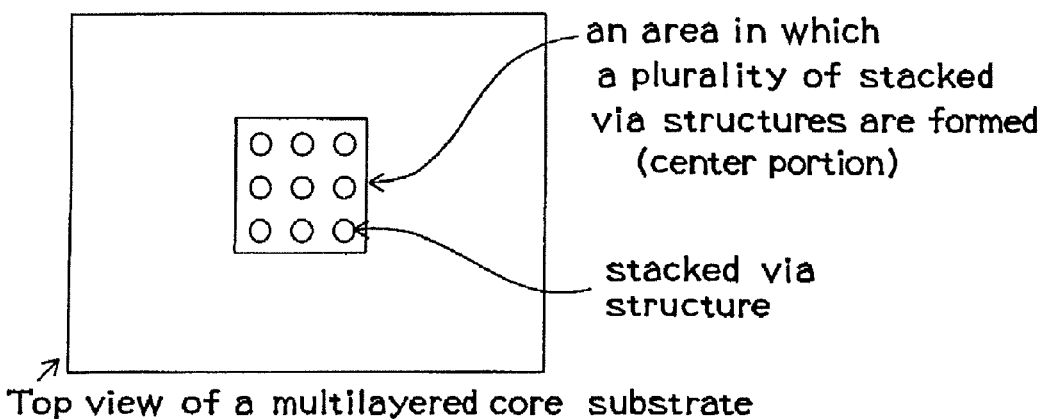
FIGS. 14(A), 14(B) and 14(C) are plan views illustrating distributions of stacked via structures in multilayered core substrates according to still other embodiments of the present invention.
Figure 14:
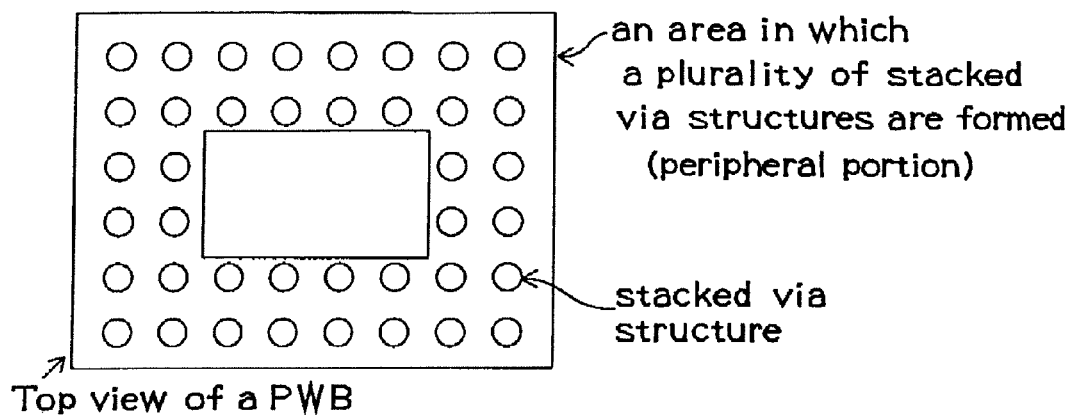
Figure 14:
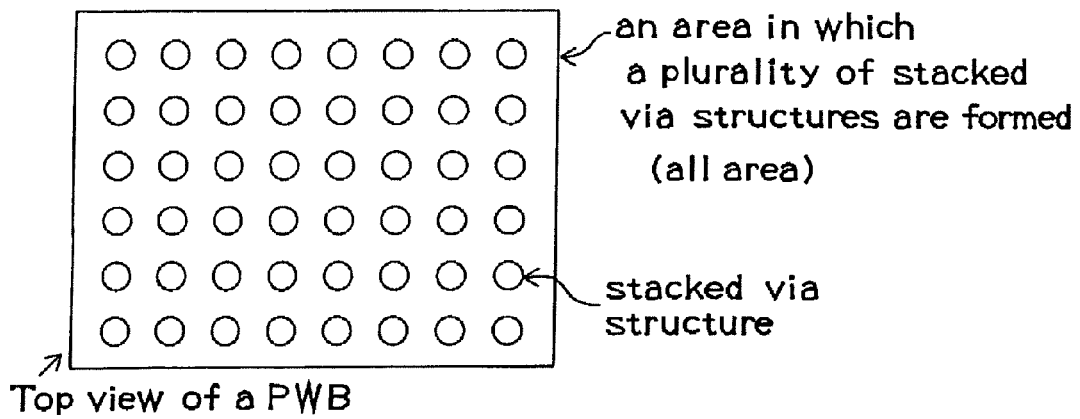

For example, referring to FIG. 14(C), by dispersing evenly the first via group and/or second via group throughout the insulation substrate, tolerance to warping from external stress factors can be ensured.

Also, referring to FIG. 14(A), by concentrating the first group and/or second via group at the center portion of the insulation substrate, the area most prone to warping from external stress factors, tolerance to external stress can be ensured.

Alternatively, referring to FIG. 14(B), the first via group and/or second via group may be positioned mainly at the periphery of the center portion, rather than at the center portion, of the insulation substrate. By such positioning, tolerance to warping at the substrate may be easier to achieve. A multilayered core substrate can retain its flatness.

Furthermore, mainly at the center portion of the insulation substrate, via holes in the first and second via groups may be structured facing each other, and in the peripheral area, via holes in the first and second via groups may be shifted away from each other.

According to the embodiments of the present invention, multiple stacked-via structures are formed by arranging in opposite directions the first via group, formed in the center insulation layer and the insulation layers laminated on one surface of the center insulation layer, and the second via group, formed in the insulation layers laminated on the other surface of the center insulation layer. Also, via holes in each via group are shaped tapering toward the bottom of the insulation layer, namely, with respect to the surface of the insulation layer or with respect to the surface of the conductor circuit formed thereon. Therefore, even if the thickness of the laminated insulation layer or insulation substrate is approximately 250 μm or less, warping at the insulation layer or insulation substrate from external stress factors (indicating an impact from being dropped or the like) can be suppressed.

Consequently, the reliability of a multilayered PWB, or its tolerance to impact, can be ensured.

Also, since the multiple stacked vias are formed inside the insulation layers, they work as a stake against warping, and insulation layers or insulation substrates resist warping. Consequently, a core substrate can remain level, and its reliability under reliability testing such as heat cycle conditions can be ensured.

Furthermore, it is useful when forming a multilayered core substrate by using insulation layers or insulation substrates, each with a thickness of approximately 100 μm or less, forming conductor circuits on them, then laminating them in multiple layers. The reliability of the multilayered PWB, or its tolerance to impact, is expected to be ensured.

Also, by forming the multiple stacked vias (the first via group and second via group) to face each other, it is useful against warping in both inner and outer directions at the insulation layer or insulation substrate. As a result, the reliability of the multilayered PWB, or its tolerance to impact, can be ensured.

Also, by positioning multiple stacked vias in opposite directions, the rigidity of the insulation substrate itself is ensured.

Interlaminar insulation layers (insulation material without core material) are formed on one or both surfaces of a multilayered core substrate. Then, via holes are formed in the interlaminar insulation layers to make conductor layers. As a result, a multilayered PWB is obtained, with electrical connections through conductor circuits in a multilayered core substrate and via holes in the interlaminar insulation layers.

Obviously, numerous modifications and variations of the present invention are possible in light of the above teachings.

It is therefore to be understood that within the scope of the appended claims, the invention may be practiced otherwise than as specifically described herein.

What is claimed as new and desired to be secured by Letters Patent of the United States is:

1. A method of manufacturing a multilayered printed wiring board, comprising:

forming a multilayered core substrate comprising a plurality of insulation layers and at least one stacked via structure formed through the plurality of insulation layers, the stacked via structure comprising a plurality of vias formed in the plurality of insulation layers, respectively, each of the insulation layers in the multilayered core substrate comprising a core material impregnated with a resin; and forming, over the multilayered core substrate, a build-up structure comprising a plurality of interlaminar insulation layers and a plurality of conductor circuits, each of the interlaminar insulation layers comprising a resin material without a core material, wherein the forming of the multilayered core substrate comprises forming the plurality of insulation layers having a number of layers which is 2N+1 where N is a natural number and forming the vias in the stacked via structure in a tapered shape such that a first via group is formed in N+1 layers of the insulation layers, that a second via group is formed in N layer or layers of the insulation layers, and that the first via group and the second via group face in opposite directions, and the forming of the build-up structure comprises forming at least one via over the first via group formed in the N+1 layers of the insulation layers and forming at least one via over the second via group formed in the N layer or layers of the insulation layers.

2. The method of manufacturing a multilayered printed wiring board according to claim 1, wherein the forming of the multilayered core substrate comprises: preparing an insulation base material laminated with a conductive film on at least one side of the insulation base material and comprising a core material impregnated with a resin and laminated; forming a via-hole opening through the insulation base material; forming a plated layer comprising a conductive metal by plating the insulation base material over the metal film such that the via-hole opening is filled; and forming at least one conductor circuit on the insulation base material from the metal film and the plated layer; and laminating another insulation base material laminated with a conductive film on at least one side of the insulation base material and comprising a core material impregnated with a resin and laminated.

3. The method of manufacturing a multilayered printed wiring board according to claim 1, wherein the forming of the multilayered core substrate comprises forming a plurality of stacked via structures in a center portion of the multilayered core substrate.

4. The method of manufacturing a multilayered printed wiring board according to claim 1, wherein the forming of the multilayered core substrate comprises forming a plurality of stacked via structures in a periphery of a center portion of the multilayered core substrate.

5. The method of manufacturing a multilayered printed wiring board according to claim 1, wherein the forming of the multilayered core substrate comprises forming a plurality of stacked via structures evenly throughout the multilayered core substrate.

6. The method of manufacturing a multilayered printed wiring board according to claim 1, wherein at least one of the vias in the stacked via structure is formed offset from another of the vias in the stacked via structure in a direction substantially perpendicular to an axial direction of the stacked via structure.

7. The method of manufacturing a multilayered printed wiring board according to claim 1, wherein the at least one stacked via structure comprises a plurality of stacked via structures which are formed in a peripheral portion of the multilayered core substrate and comprise at least one stacked via structure comprising at least one via formed offset from another via in the stacked via structure in a direction substantially perpendicular to an axial direction of the stacked via structure.

8. The method of manufacturing a multilayered printed wiring board according to claim 7, wherein the at least one via formed offset from another via in the stacked via structure is offset in a direction away from a center portion of the multilayered core substrate.

9. The method of manufacturing a multilayered printed wiring board according to claim 8, wherein the at least one stacked via structure further comprises a plurality of stacked via structures formed in the center portion of the multilayered core substrate.

10. The method of manufacturing a multilayered printed wiring board according to claim 9, wherein the plurality of stacked via structures formed in the center portion of the multilayered core substrate comprise at least one stacked via structure comprising vias substantially aligned with one another along an axial direction of the stacked via structure.

11. The method of manufacturing a multilayered printed wiring board according to claim 1, wherein the multilayered core substrate has a three-layered structure having the plurality of insulation layers.

12. The method of manufacturing a multilayered printed wiring board according to claim 11, wherein the three-layered structure comprises a center insulation layer, a first outer insulation layer formed on a first side of the center insulation layer and a second outer insulation layer formed on a second side of the center insulation layer opposite to the first side, and the first outer insulation layer and the second outer insulation layer have substantially the same thickness.

13. The method of manufacturing a multilayered printed wiring board according to claim 12, wherein the vias in the stacked via structure comprise a first via formed in the first outer insulation layer and a second via formed in the second outer insulation layer, and the first via and the second via are tapered in opposite directions.

14. The method of manufacturing a multilayered printed wiring board according to claim 1, wherein the at least three insulation layers in the multilayered core substrate comprises a center insulation layer, a first outer insulation layer formed on a first side of the center insulation layer and a second outer insulation layer formed on a second side of the center insulation layer opposite to the first side, and the first outer insulation layer and the second outer insulation layer have substantially the same thickness.

15. The method of manufacturing a multilayered printed wiring board according to claim 14, wherein the vias in the stacked via structure comprise a first via formed in the first outer insulation layer and a second via formed in the second outer insulation layer, and the first via and the second via are tapered in opposite directions.

16. The method of manufacturing a multilayered printed wiring board according to claim 1, wherein the core material comprises at least one of glass cloth and aramid non-woven fabric.

17. The method of manufacturing a multilayered printed wiring board according to claim 1, wherein the multilayered core substrate has a first surface and a second surface opposite to the first surface, and the plurality of interlaminar insulation layers is formed on each of the first surface and the second surface.

* * * * *